United States Patent
Kamata et al.

(10) Patent No.: US 7,986,016 B2
(45) Date of Patent: Jul. 26, 2011

(54) SEMICONDUCTOR DEVICE AND ASSOCIATED MANUFACTURING METHODOLOGY FOR DECREASING THERMAL INSTABILITY BETWEEN AN INSULATING LAYER AND A SUBSTRATE

(75) Inventors: Yoshiki Kamata, Meguro-ku, Tokyo (JP); Akira Takashima, Fuchu-shi, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/482,054

(22) Filed: Jun. 10, 2009

(65) Prior Publication Data
US 2010/0065886 A1 Mar. 18, 2010

(30) Foreign Application Priority Data
Sep. 12, 2008 (JP) ................. 2008-235514

(51) Int. Cl.
H01L 29/51 (2006.01)
H01L 21/28 (2006.01)

(52) U.S. Cl. ......... 257/411; 257/E29.132; 257/E21.207; 438/591

(58) Field of Classification Search .......... 257/192, 257/410, 411, 616, E29.128, E29.132, E29.162, 257/E29.255, E2, 1.403, E21.409, E21.129, 257/E21.207; 438/285, 590, 591
See application file for complete search history.

(56) References Cited

U.S. PATENT DOCUMENTS
| 6,143,072 A | * | 11/2000 | McKee et al. | ......... 257/E29.152 |
| 6,652,989 B2 | * | 11/2003 | McKee et al. | ................. 428/633 |
| 2002/0197789 A1 | * | 12/2002 | Buchanan et al. | ............ 438/785 |

FOREIGN PATENT DOCUMENTS
JP 2005-191293 7/2005

OTHER PUBLICATIONS

Yoshiki Kamata, "High-k/Ge MOSFETs for Future Nanoelectronics", Materials today, vol. 11, No. 1-2, Jan.-Feb. 2008, pp. 30-38.
S. Takagi, et al., "Gate Dielectric Formation and MIS Interface Characterization on Ge", Microelectronic Engineering 84, 2007, pp. 2314-2319.
A. Takashima, et al., Improvement of Electrical Properties of La Aluminates/Si (100) Interface by Insertion of one Monolayer Epitaxial $SrSi_2$, 2008, pp. 107-112.
J. Evers, et al., "Electrical Properties of Alkaline Earth Disilicides and Digermanides", Mat. Res. Bull., vol. 9 No. 5, 1974, pp. 549-553.

(Continued)

Primary Examiner — Benjamin P Sandik
Assistant Examiner — W. Wendy Kuo
(74) Attorney, Agent, or Firm — Oblon, Spivak, McClelland, Maier & Neustadt, L.L.P.

(57) ABSTRACT

According to an aspect of the present invention, there is provided a semiconductor device including: a substrate that includes a semiconductor region including Ge as a primary component; a compound layer that is formed above the semiconductor region, that includes Ge and that has a non-metallic characteristic; an insulator film that is formed above the compound layer; an electrode that is formed above the insulator film; and source/drain regions that is formed in the substrate so as to sandwich the electrode therebetween.

21 Claims, 20 Drawing Sheets

OTHER PUBLICATIONS

R. A. McKee, et al., "Physical Structure and Inversion Charge at a Semiconductor Interface with a Crystalline Oxide", Science American Association for the Advancement of Science, vol. 293, Jul. 20, 2001, 5 pages.

D.B. Migas, et al., "Isostructural $BaSi_2$, $BaGe_2$ and $SrGe_2$ Electronic and Optical Properties", Physica Status Solidi. (b) 244, No. 7, 2007, pp. 2611-2618.

"X-ray Photoelectron Spectroscopy", The Surface Science Society of Japan, ISBN 4-621-04469-9 C 3342, 1998, 3 pages.

H. Van Doveren, et al., "XPS Spectra of Ca, Sr, Ba and Their Oxides", Journal of Electron Spectroscopy and Related Phenomena, 21, 1980, 5 pages.

W. F. Gale, et al., "Smithells Metals Reference Book", Equilibrium Diagrams, 2004, 3 pages.

Office Action dispatched Nov. 16, 2010, in Japanese Patent Application No. 2008-235514, filed Sep. 12, 2008 (with English-language Translation).

* cited by examiner

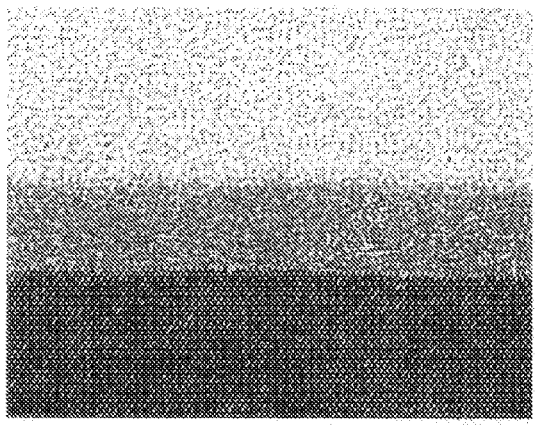 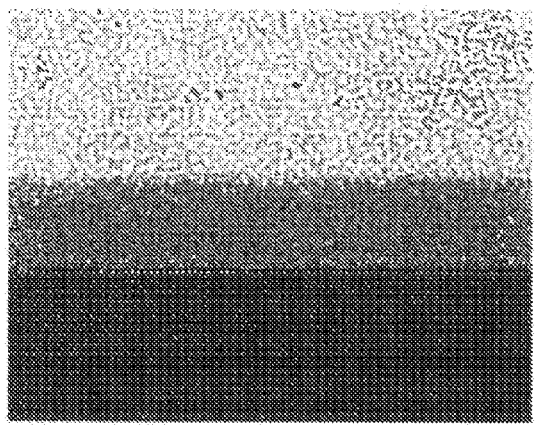
*Fig. 7A*  *Fig. 7B*

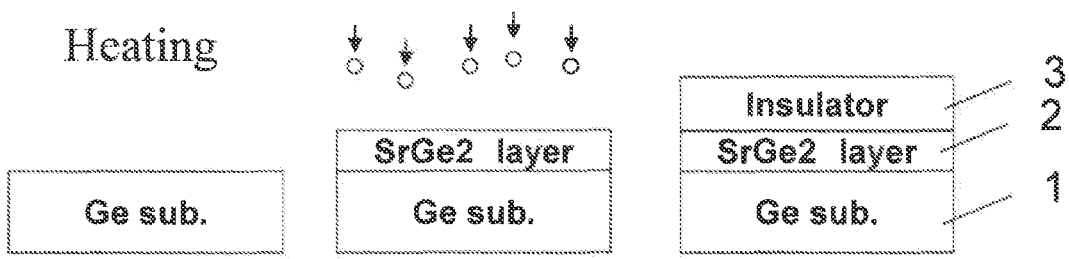
*Fig. 12A*   *Fig. 12B*   *Fig. 12C*
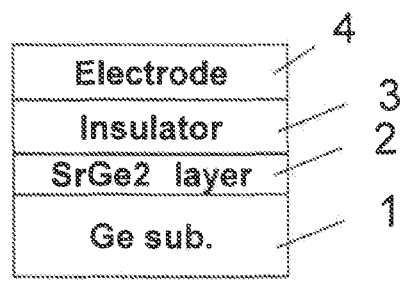
*Fig. 12D*

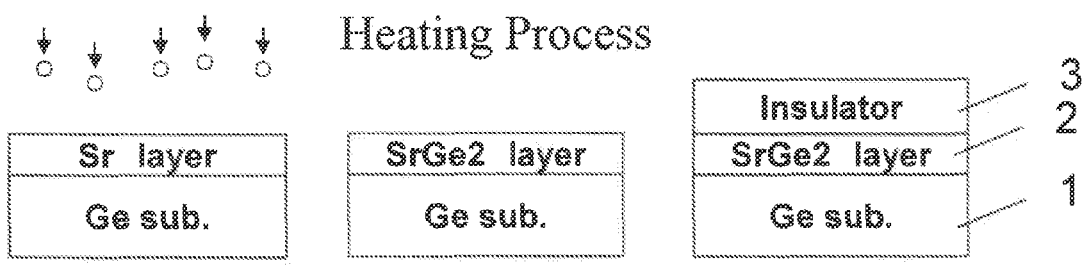
*Fig. 13A*   *Fig. 13B*   *Fig. 13C*
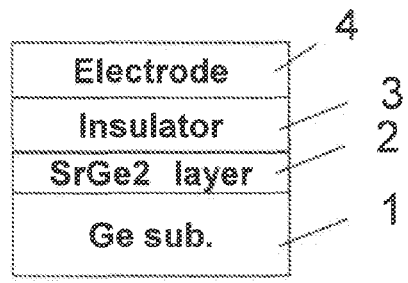
*Fig. 13D*

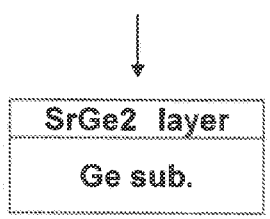
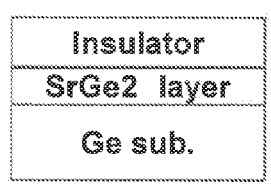
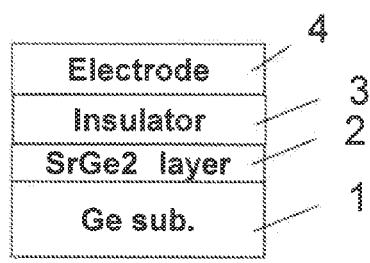
*Fig. 14A*  *Fig. 14B*  *Fig. 14C*

Depositing Sr in
Oxygen Atmosphere
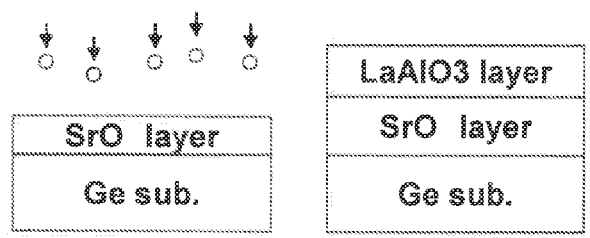
Heating Process
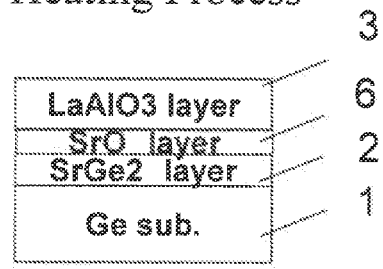
*Fig. 15A*  *Fig. 15B*  *Fig. 15C*
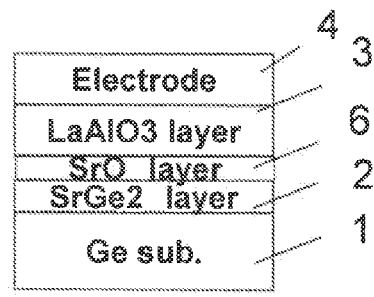
*Fig. 15D*

Sr Ion Implantation
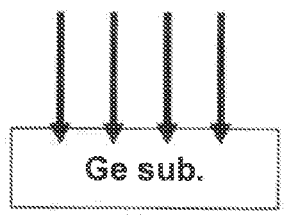
*Fig. 16A*
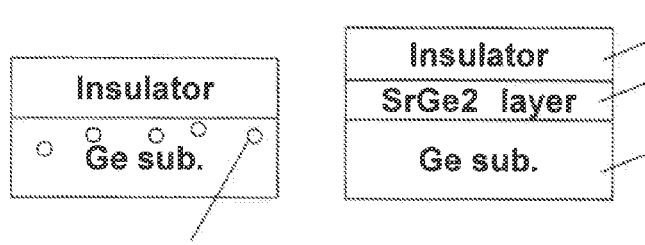
Heating Process
*Fig. 16B*          *Fig. 16C*
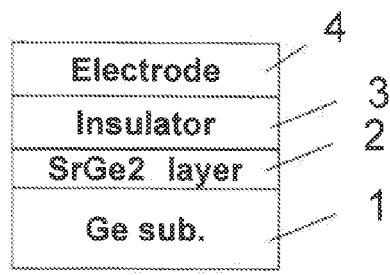
*Fig. 16D*

Temperature Adjustment
(Cooling)
Depositing Sr
Heating Process
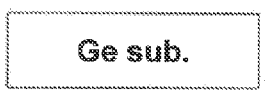
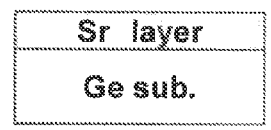
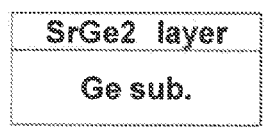
*Fig. 18A*
*Fig. 18B*
*Fig. 18C*
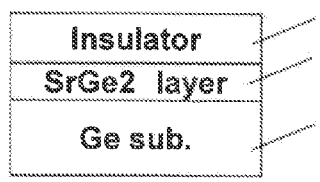
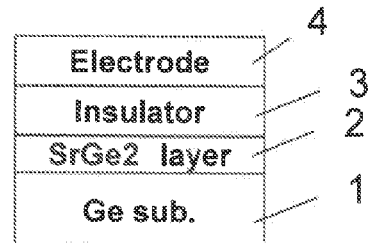
*Fig. 18D*
*Fig. 18E*

SEMICONDUCTOR DEVICE AND ASSOCIATED MANUFACTURING METHODOLOGY FOR DECREASING THERMAL INSTABILITY BETWEEN AN INSULATING LAYER AND A SUBSTRATE

CROSS-REFERENCE TO RELATED APPLICATIONS

This application claims priority from Japanese Patent Application No. 2008-235514 filed on Sep. 12, 2008, the entire contents of which are incorporated herein by reference.

BACKGROUND OF THE INVENTION

1. Field of the Invention

An aspect of the present invention relates to a semiconductor device including a semiconductor region having Ge as a primary component and an insulator film, and a method for manufacturing the semiconductor device.

2. Description of the Related Art

One of technical issues of Ge MOS (Metal/Oxide/Semiconductor) devices is thermal instability in an interface between an insulator and a Ge substrate. Particularly degassing of reducing gas GeO(g) from the interface becomes a problem. Due to the degassing, the characteristics of the interface may deteriorate, and further the mobility may fall down.

One solution has been reported, in which N or Zr is mixed into interface Ge oxide to increase the thermal stability of the interface so that degassing can be suppressed effectively (Kamata, Y., Materials Today (2008) 11, 30). In this method, however, the interface characteristics deteriorate due to the Ge oxide, and the mobility is also low.

As another solution, there has been researched a method in which no thermally instable Ge oxide is formed in the insulator/Ge interface. For example, there has been researched a method for suppressing formation of an interface Ge oxide layer by a method in which $Ge_3N_4$ is formed by plasma nitriding (Takagi, S., et al., Microelectron. Eng. (2007) 84, 2314) or a method in which an Si cap layer is formed on a Ge substrate (Kamata, Y., Materials Today (2008) 11, 30). The method of plasma nitriding can form a fresh reaction interface so that it can be expected to improve the interface characteristics. However, there is a fear that the mobility may deteriorate due to nitrogen introduced into the interface. The method of forming Si cap layer can make use of knowledge of insulator/Si gate stacks. However, there is a fear that the mobility may deteriorate due to the existence of the Si cap layer itself, Ge may diffuse into an insulator/Si interface and consequently a Ge oxide interface layer may be formed, the characteristics of an insulator film/substrate interface may deteriorate, or the characteristics may deteriorate due to a defect of an Si/Ge interface.

There is another report about a method in which $SrSi_2$ is put in an insulator film/Si interface in an Si MOS device so as to improve the interface characteristics (Akira Takashima, et al., 13th Workshop on Gate Stack Technology and Physics (2008)). This $SrSi_2$ is not a bulk material but an adsorption layer where $SrSi_2$ is adsorbed in the surface of a semiconductor substrate. As reported in Evers, J. and Weiss, A., Mater. Res. Bull. (1974) 9, 549 (Table 1), $SrSi_2$ is a metal with a band cap of 0, similar to general metal germanides. Akira Takashima, et al., 13th Workshop on Gate Stack Technology and Physics (2008) also says that Sr deposited on a washed Si (2×2) surface shows no reaction with Si even if the temperature of Sr increases, but Sr is desorbed at about 800° C. and only a one-atom layer corresponding to adsorbed Sr stays on the Si substrate.

SUMMARY OF THE INVENTION

According to an aspect of the present invention, there is provided a semiconductor device including: a substrate that includes a semiconductor region including Ge as a primary component; a compound layer that is formed above the semiconductor region, that includes Ge and that has a non-metallic characteristic; an insulator film that is formed above the compound layer; an electrode that is formed above the insulator film; and source/drain regions that is formed in the substrate so as to sandwich the electrode therebetween.

According to another aspect of the present invention, there is provided a method for manufacturing a semiconductor device, including: preparing a substrate that includes a semiconductor region including Ge as a primary component; forming a compound layer above the semiconductor region, the compound layer including Ge, the compound layer having a non-metallic characteristic; forming an insulator film above the compound layer; forming an electrode above the insulator film; and forming source/drain regions in the substrate so as to sandwich the electrode therebetween.

BRIEF DESCRIPTION OF THE DRAWINGS

FIGS. 7A and 7B are X-TEM images of samples according to the second embodiment.

FIGS. 12A-12D are schematic diagrams showing a typical example of the second embodiment.

FIGS. 13A-13D are schematic diagrams showing a typical example of a third embodiment of the invention.

FIGS. 14A-14C are schematic diagrams showing a typical example of a fifth embodiment of the invention.

FIGS. 15A-15D are schematic diagrams showing a typical example of the sixth embodiment.

FIGS. 16A-16D are schematic diagrams showing a typical example of a seventh embodiment of the invention.

FIGS. 18A-18E are schematic diagrams showing a typical example of a ninth embodiment of the invention.

DETAILED DESCRIPTION OF THE INVENTION

Embodiments of the present invention will be described below with reference to the drawings. Constituent parts common among the embodiments are referred to by the same numerals and duplicate description thereof will be omitted. Each drawing is a schematic diagram for facilitating understanding of the invention. In each drawing, shapes, dimensions, ratios, etc. may be different from those in a real device. Designs for these shapes, dimensions, ratios, etc. may be changed desirably in consideration of the following description and known technologies.

First Embodiment

Figure 1:
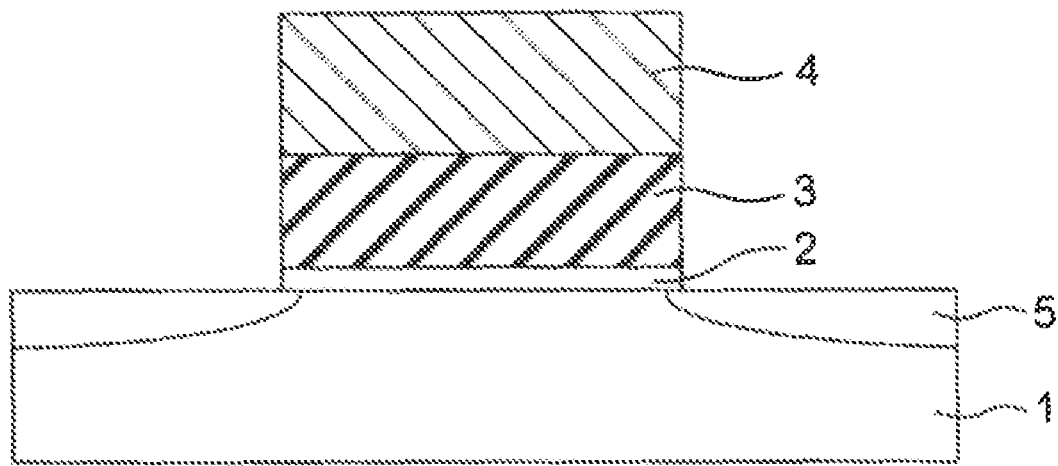
FIG. 1 is a schematic cross-sectional view of a semiconductor device according to a first embodiment of the invention.

FIG. 1 is a schematic cross-sectional view of a MISFET according to a first embodiment of the invention. As shown in FIG. 1, the MISFET according to the first embodiment has a non-metallic Ge compound layer 2 formed on a semiconductor substrate 1 having Ge as a primary component, an insulator film 3 formed on the non-metallic Ge compound layer 2, agate electrode 4 formed on the insulator film 3, and source/drain regions 5 formed on the semiconductor substrate 1 on the opposite sides of the gate electrode 4.

The non-metallic Ge compound layer 2 is a compound of metal and Ge (metal germanide: MGex). The non-metallic Ge compound layer 2 has a band gap and exhibits a non-metallic characteristic. Superior mobility can be achieved by providing the non-metallic Ge compound layer 2 between an insulator and a Ge semiconductor as will be described in detail later.

For example, a compound of Sr and Ge, a compound of Ba and Ge, and a compound of Ba, Si and Ge are used as the non-metallic Ge compound layer 2. For example, band gaps (Eg) of disilicide and digermanide have been reported as values shown in Table 1 (Evers, J. and Weiss, A., Mater. Res. Bull. (1974) 9, 549).

TABLE 1

| | Eg | |
|---|---|---|
| Group II | $XGe_2$ | $XSi_2$ |
| Ca | Metal | Metal |
| Sr | 0.9 | Metal |
| Ba | 1.0 | 1.3 |

Examples of stable compounds of Sr and Ge (Sr germanide) include $SrGe_2$, $SrGe$, $Sr_2Ge$ and $Sr_4Ge_3$. These compounds may be used alone or in combination as the non-metallic Ge compound layer 2.

Likewise, examples of stable compounds of Ba and Ge (Ba germanide) include $Ba(Si_{1-x}Ge_x)_2$, $Ba(Si_{1-x}Ge_x)$, $Ba_2(Si_{1-x}Ge_x)$ and $Ba_4(Si_{1-x}Ge_x)_3$ ($0 \leq x \leq 1$). These compounds may be used alone or in combination as the non-metallic Ge compound layer 2.

For example, $SrGe_2$ and $BaGe_2$ are preferably used as the compound of metal and Ge. Since these compounds have the c-axis values close to twice the lattice constant of Ge, good lattice matching can be obtained easily at the interface between the non-metallic Ge compound layer 2 and the semiconductor substrate 1, and the adverse effect caused by an unintentionally-induced strain can be reduced. Further, it is expected that good electric characteristics can be obtained when these compounds are epitaxially grown (R. A. Mckee, et al., Science, 293 468 (2001)). Table 2 shows the c-axis values of $SrGe_2$ and $SrSi_2$ disclosed in Migas, D. B., et al., physica status solidi (b) (2007) 244, 2611, in comparison with twice as high as the lattice constants of Ge and Si.

TABLE 2

| Group II | c (nm) in × $Ge_2$ | c (nm) in × $xSi_2$ | Lattice Mismatch c/2a(Ga) | c/2a(Si) |
|---|---|---|---|---|
| Sr | 1.124 | | 0.7% | |
| Ba | 1.165 | 1.158 | −2.9% | 6.6% |

A film of dielectric oxide, such as metal oxide of Hf, Zr, La, Al or the like, is used as the insulator film 3. Since the non-metallic Ge compound layer 2 comes in contact with the Ge substrate 1 and the insulator film 3 does not come in contact therewith, it is not necessary to select the dielectric oxide film based on interface characteristics with Ge. Therefore, it is possible to select the dielectric oxide film based on the other characteristics (e.g. EOT). For example, in order to attain a small Equivalent Oxide Thickness (EOT), oxide containing La and Al, such as $LaAlO_3$, is used Another insulator layer may be further put between the insulator film 3 and the non-metallic Ge compound layer 2. An example of such an insulator layer includes Sr oxide or Ba oxide.

Although FIG. 1 illustrates the semiconductor substrate 1 having Ge as a primary component, the substrate in which at least the region under the non-metallic Ge compound layer 2 having Ge as a primary component may be used. For example, a structure in which a region having Ge as a primary component is formed on a Si substrate may be used.

The Ge concentration of the semiconductor region is not limited to 100% but the semiconductor region may be made of SiGe. In the case of SiGe, it is desired that the Ge concentration is not lower than 85%. In the SiGe substrate having Ge concentration higher than 85%, the band gap Eg abruptly decreases with the increase of the Ge concentration because the conduction minima at Δ in Si and L in Ge cross in k-space. In source/drain regions of a transistor, since metallurgical junctions are terminated in an insulator film/substrate interface of MOS, the leakage current through interface states in the insulator film/substrate interface, that is, a perimeter component of the leakage current may appear conspicuously. The perimeter leakage current becomes conspicuous in the case of many interface states and in the case of a small Eg of the substrate. Accordingly, when the aforementioned non-metallic Sr germanide layer is formed on a SiGe substrate having 85% or higher Ge concentration, the perimeter leakage current component through the interface states can highly effectively be reduced.

A metal electrode or the like is used as the gate electrode 4. Specifically, simple metals such as Pt, Mo, Ti, Ta, W, etc., their nitrides or carbides, their silicides or germanides which are compounds with Si or Ge, etc. can be used.

Although diffusion layers having impurities are used as the source/drain regions 5 in FIG. 1, metal electrodes (so-called Schottky source/drain) may be used.

Although FIG. 1 has been described using a planar MOSFET (MISFET), the present invention is not limited thereto, but it can be also applied to 3-dimensional devices such as Fin type device.

Second Embodiment

A second embodiment of the invention explains a method for manufacturing the semiconductor device according to the first embodiment. In the second embodiment, the temperature of the Ge substrate is increased, and metal containing Sr or Ba is deposited while keeping the temperature, so as to form the non-metallic Ge compound layer. FIGS. 12A-12D show a typical example of the second embodiment.

Specific description will be made below.

First, pretreatment is carried out to wash the Ge (100) substrate surface. As the pretreatment, for example, the surface is first treated with acetone for degreasing or removing organic matter, washed with a mixture of hydrochloric acid (20%) and hydrogen peroxide solution (0.1%) for removing contamination of metallic elements or the like, and dried. In the pretreatment, rinsing with pure water or ultrasonic cleansing may be inserted. Treatment with aqueous ammonia or RCA washing for use in forming Si devices may be also used with reduced concentration of hydrogen peroxide solution.

After that, the pretreated Ge substrate is conveyed to an insulator film forming apparatus. Here, description will be made on an example in which a molecular beam epitaxy (MBE) method is used as an insulator film forming method. The Ge substrate is conveyed to a film forming chamber. The Ge substrate is heated to about 400° C. in an ultra vacuum (for example, $5 \times 10^{-8}$ Torr or lower). Appearance of a washed surface of Ge (2×1) is confirmed by a reflection high energy electron diffraction (RHEED) method (see FIG. 2).

Figure 3:
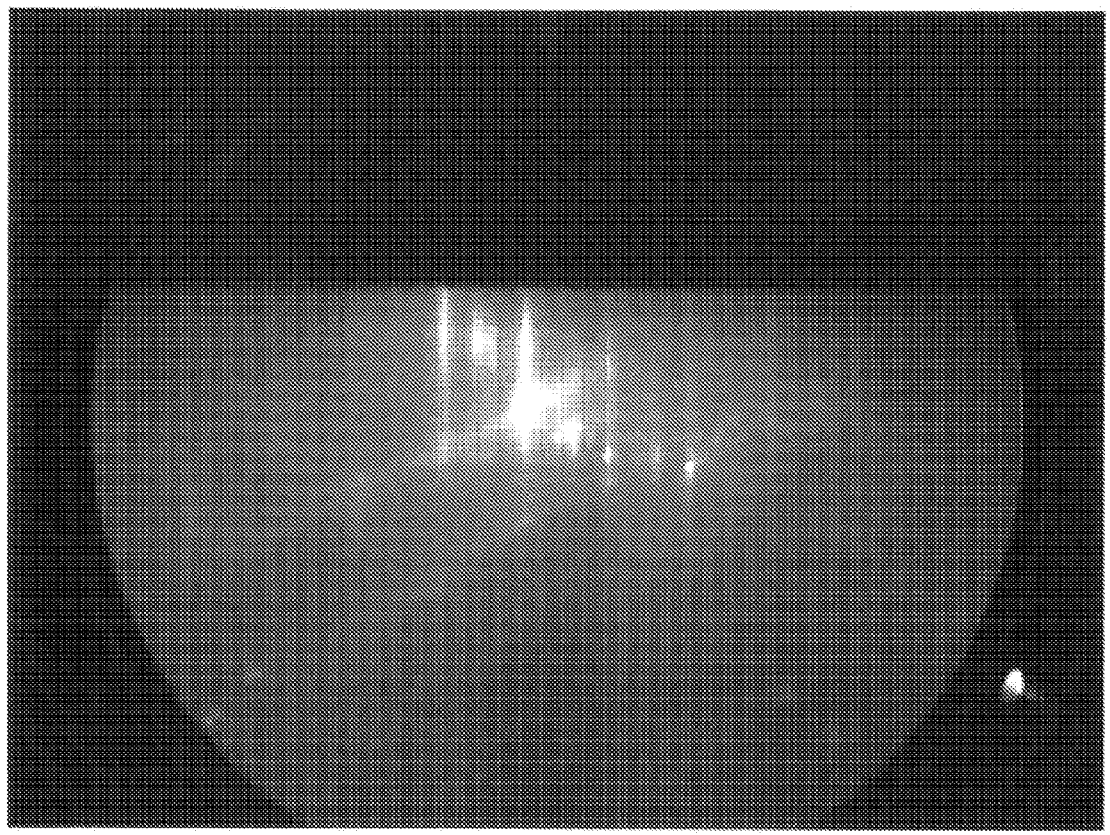
FIG. 3 is a RHEED image in an early stage of Sr deposition.
Figure 4:
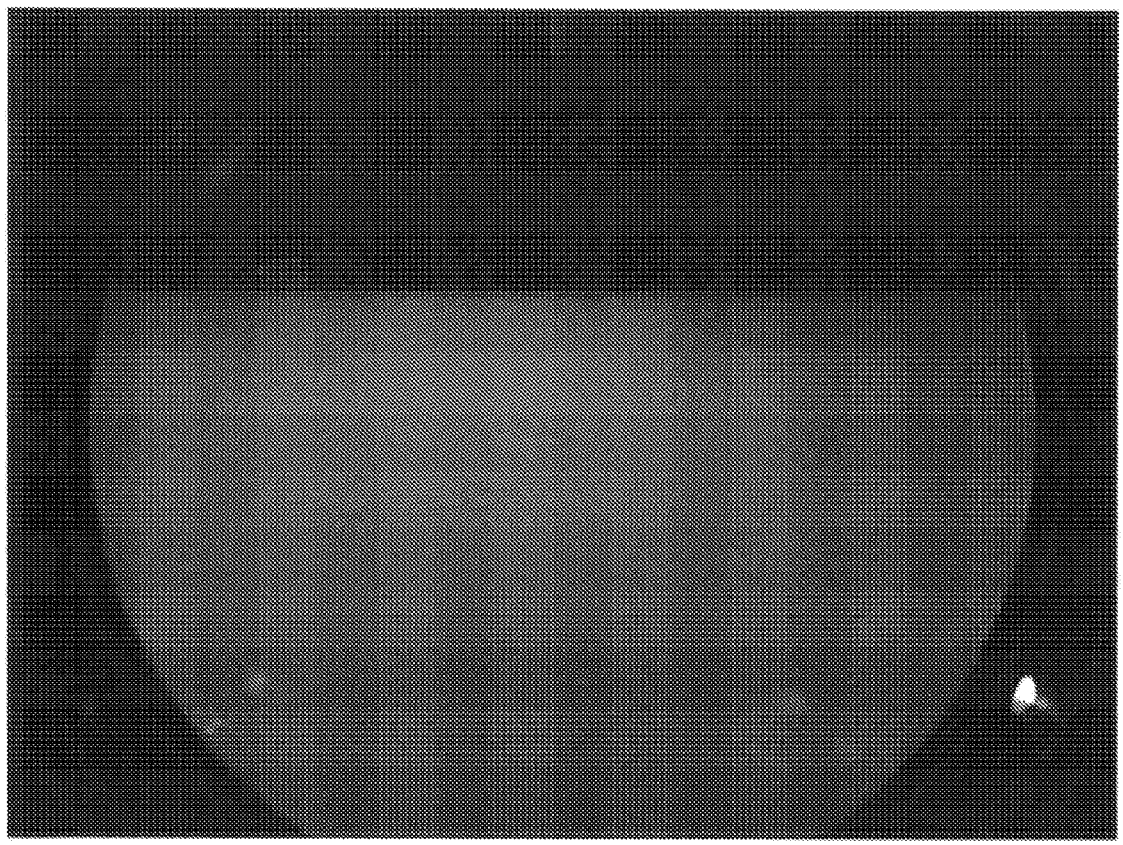
FIG. 4 is a RHEED image in a final stage of Sr deposition.

Next, 1 ML of Sr is deposited with the temperature being kept. As the deposition of Sr progresses, Ge (2×1) disappears from a RHEED image, and a new streak pattern derived from Sr is observed (see FIG. 3). It is therefore considered that a reconstructed periodic structure derived from Sr is formed on the washed Ge surface. In the final stage of the Sr deposition, the streak pattern becomes cloudy (see FIG. 4). It is therefore considered that, after the reconstructed periodic structure derived from Sr is formed on the washed Ge surface, a Sr metal layer is deposited amorphously.

For example, the heating temperature of the Ge substrate when the metal is deposited may be set to be not lower than 200° C. and not higher than 800° C. When the temperature is not lower than 200° C., Sr reacts with Ge as soon as Sr is deposited thereon. When the temperature is not higher than 769° C. that is the melting point of Sr, most Sr can be deposited on the Ge substrate without evaporating. For example, by setting the temperature to be not lower than about 600° C., Sr not being reacted with Ge sufficiently is evaporated so as to surely form only a Sr germanide layer. For example, the pressure is set to be not higher than $5 \times 10^{-8}$ Torr to prevent the Sr surface from being oxidized by water or oxygen.

Next, a gate insulator film is deposited. Here, using two Knudsen Cells (K-cells) of La and Al, 5 nm of $LaAlO_3$ is deposited in an oxygen atmosphere.

Although MBE is used to form $LaAlO_3$ in this embodiment, another film forming method such as, chemical vapor deposition (CVD), atomic layer chemical vapor deposition (AL-CVD), pulse laser deposition (PLD), sputter deposition, vapor deposition, or the like, may be used.

After that, heat treatment at 500° C. is carried out upon some samples in an $N_2$ atmosphere for 30 minutes.

Samples obtained thus are physically analyzed. The physical analysis is carried out by X-ray photoelectron spectroscopy (XPS), high-resolution Rutherford backscattering spectroscopy (HRBS) and cross-sectional transmission electron microscope (X-TEM) measurement.

Figure 5:
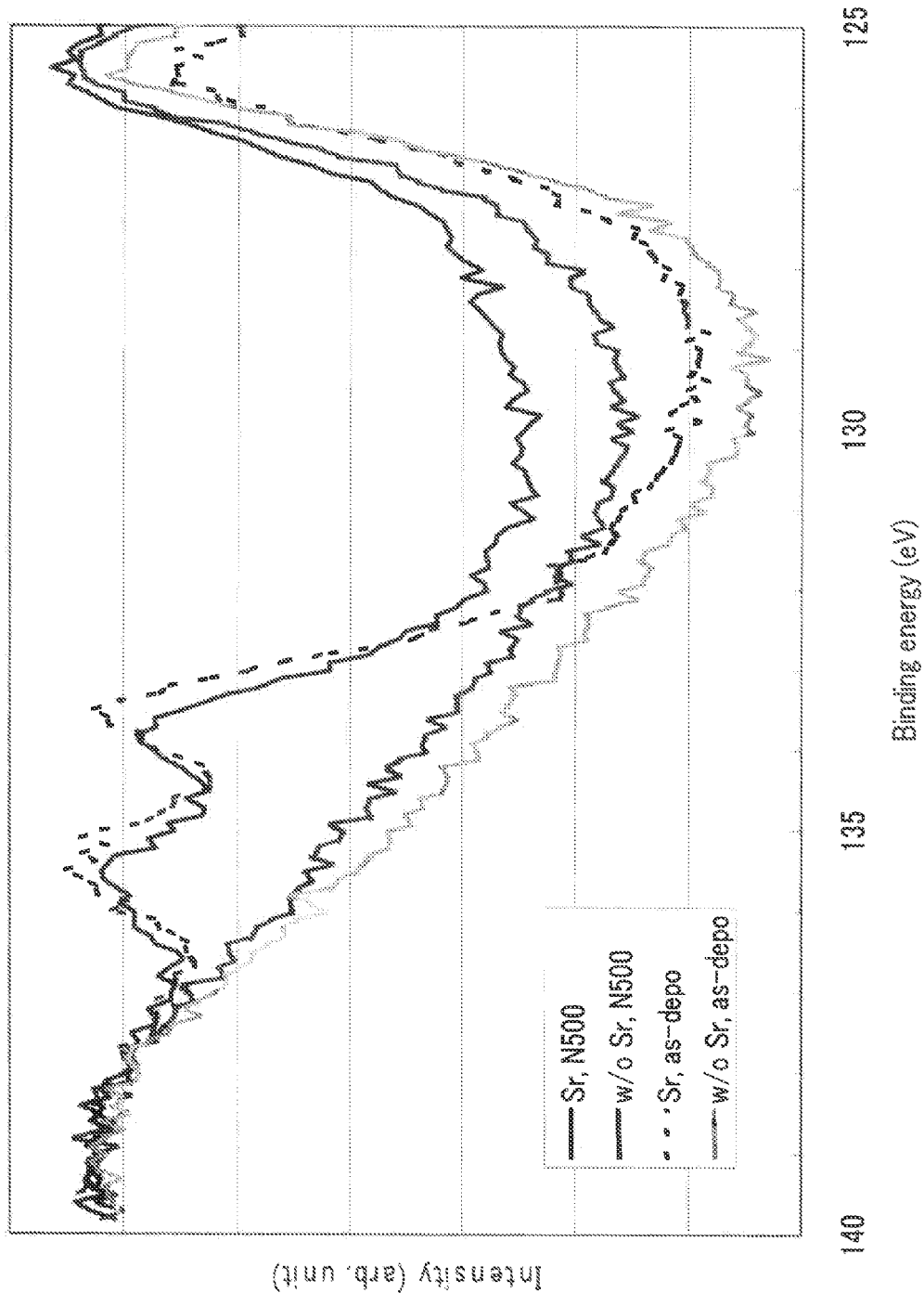
FIG. 5 is a graph showing XPS results of samples according to a second embodiment of the invention.

First, FIG. 5 shows results of XPS. Four samples are analyzed. The four samples include: the case where Sr is deposited on the $LaAlO_3$/Ge interface ("Sr" in FIG. 5); and the case where Sr is not deposited ("w/o Sr" in FIG. 5). Each case includes: the case where the heat treatment is applied ("N500" in FIG. 5); and the case where the heat treatment is not applied ("as-depo" in FIG. 5). The heat treatment is performed in nitrogen atmosphere with temperature of 500° C. The take off angle (TOA) in XPS measurement is set at 90 degrees. That is, measurement is performed with a detector placed in a position perpendicular to each sample. In addition, charge correction is applied to spectra with reference to a peak of Ge3d at 29.3 eV derived from the Ge substrate.

In FIG. 5, in addition to a peak (near 125-126 eV) derived from Ge3p1/2, peaks of Sr3d3/2 (135.5 eV) and Sr3d5/2 (133.8 eV) are observed in the samples where Sr is deposited in the $LaAlO_3$/Ge interface. Therefore, it is understood that Sr present in the samples where Sr is deposited, and Sr is not lost due to heat treatment thereon.

Figure 2:
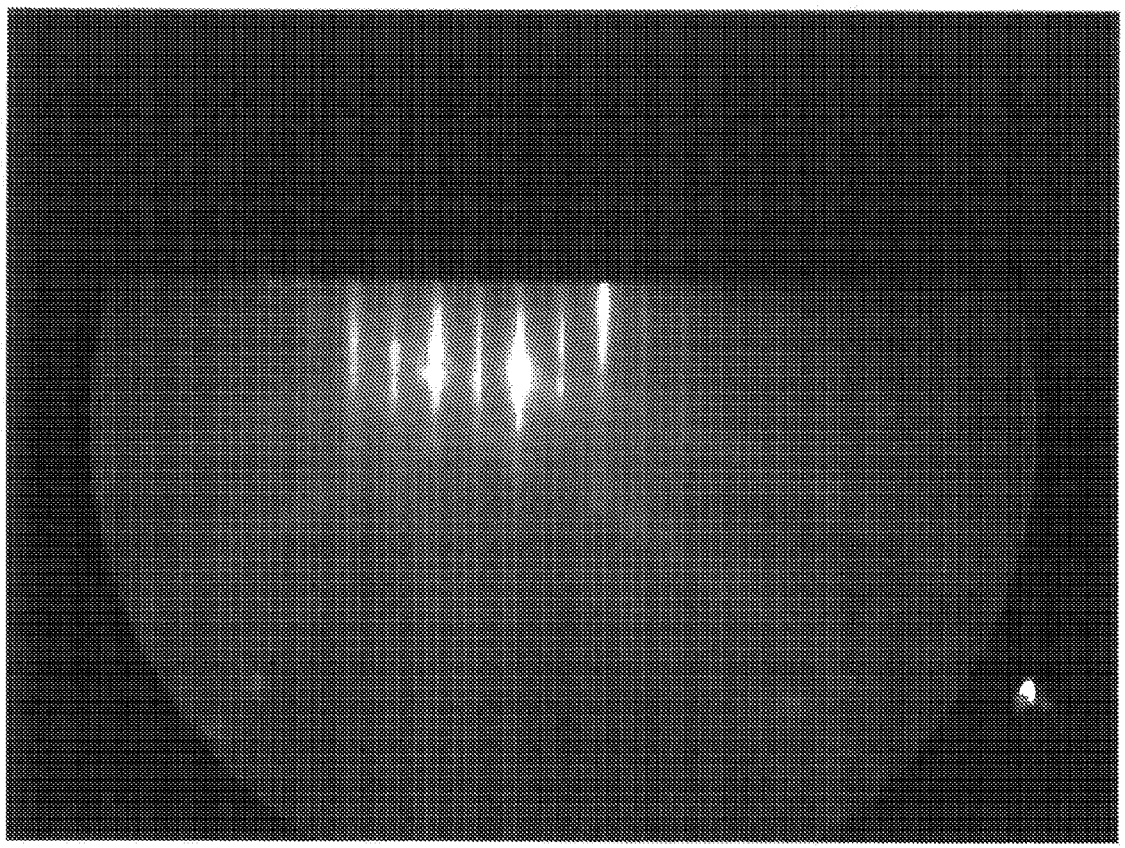
FIG. 2 is a RHEED image where a washed Ge (2×1) surface is observed.

In X-ray Photoelectron Spectroscopy (Maruzen), and in H. van Doveren, et al., J. Electron Spectrosc. Relat. Phenom. (Netherlands), 21 265 (1980) that is source document thereof, there is described that peaks appears at 134.4 eV and 135.3 ev for Sr3d5/2 in Sr—Sr bond and Sr3d5/2 in Sr—O bond respectively. The peaks of Sr3d5/2 before and after the heat treatment in FIG. 5 appear at 133.8 eV and 135.5 eV respectively. It is therefore understood that at least the peaks of Sr3d in FIG. 2 are not derived from Sr—Sr bond or Sr—O bond. On the other hand, peaks of La and Al shows that La and Al are bonding to O. Accordingly, it is understood that it is highly likely that Sr—Ge bond is formed.

Figure 6:
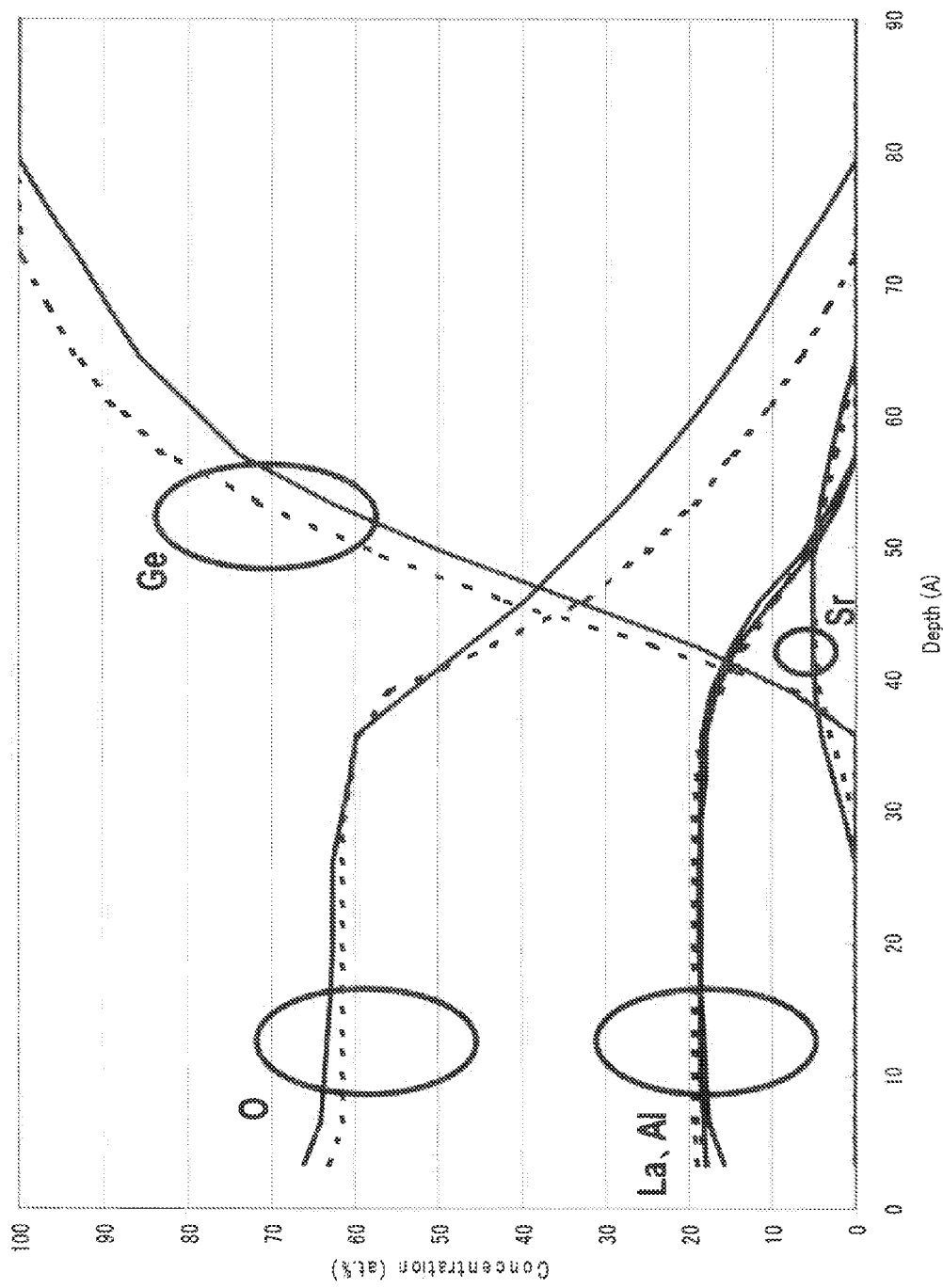
FIG. 6 is a graph showing HRBS results of samples according to the second embodiment.

Next, FIG. 6 shows the results of HRBS. Totally two samples where Sr is deposited in the $LaAlO_3$/Ge interface are analyzed. One of the samples had been heat-treated while the other had not been heat-treated. The broken line and the solid line show depth-direction profiles of each element before and after heat treatment respectively. It is proved that Sr is present in the $LaAlO_3$/Ge interface independently of the heat treatment.

Next, FIGS. 7A and 7B show X-TEM images. Two samples where Sr is deposited in the $LaAlO_3$/Ge interface are analyzed. One of the samples had been heat-treated while the other had not been heat-treated. FIG. 7A shows an X-TEM image before heat treatment, and FIG. 7B shows an X-TEM image after heat treatment. The $LaAlO_3$ film thickness is 5 nm independently of the heat treatment. There is no conspicuous difference between the images before and after the heat treatment. However, the $LaAlO_3$/Ge interface in the sample after the heat treatment looks as if it has been flattened slightly (more conspicuously in a low-magnification TEM image). Though not confirmed from FIGS. 7A and 7B, it is likely, as described previously, that a little less than 1 ML of $SrGe_2$ has epitaxially grown on the Ge substrate due to the c-axis value of $SrGe_2$ close to twice as high as the lattice constant of Ge.

Figure 8:
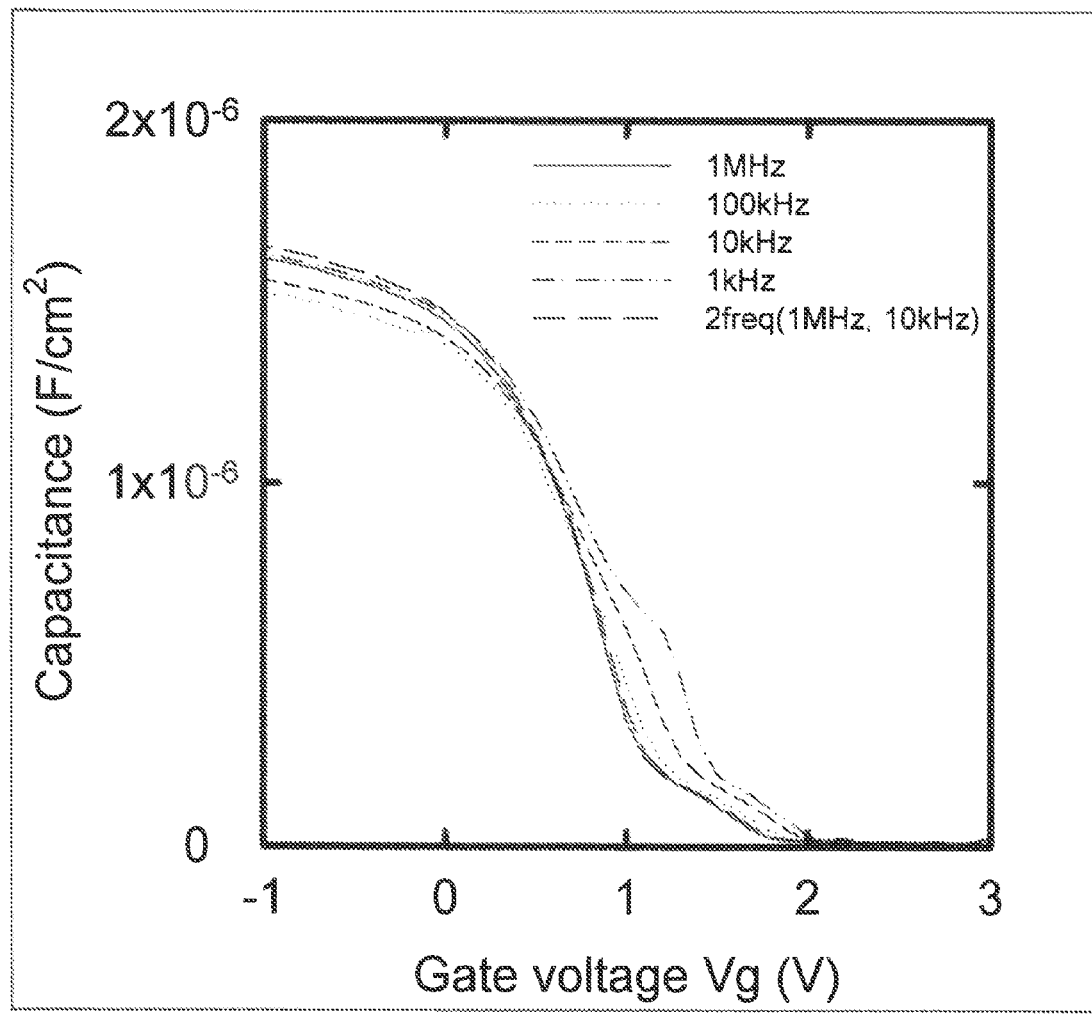
FIG. 8 is a graph showing CV characteristics of a sample according to the second embodiment.

Next, description will be made on the capacitance to voltage characteristic (CV characteristic) of a MOS capacitor. First, a gate electrode is formed in a sample subjected to heat treatment (at nitrogen atmosphere, at 500° C. and for 30 minutes) after a gate insulator film is deposited. Here, Pt as the gate electrode material is vapor-deposited with a stainless mask to form the gate electrode. After that, the back surface of the Ge substrate is treated with diluted hydrofluoric acid, and Al is then vapor-deposited on the back surface, thereby forming a Ge MOS capacitor. FIG. 8 shows the CV characteristic of the sample obtained thus. Paying attention to frequency dependency, FIG. 8 shows the CV characteristic thereof acquired at 1 kHz, 10 kHz, 100 kHz, 1 MHz and "2 freq (1 MHz and 10 kHz)" in which a dual frequency method of 1 MHz and 10 kHz is used. It is proved from the low frequency dispersion that the sample has a good CV characteristic. The interface state Dit estimated from conductance is about $2 \times 10^{12}$ (/cm²/eV), and it is proved therefrom that the sample has good interface characteristics.

After that, a MOSFET is produced by the following process, and the mobility thereof is measured.

Figure 9:
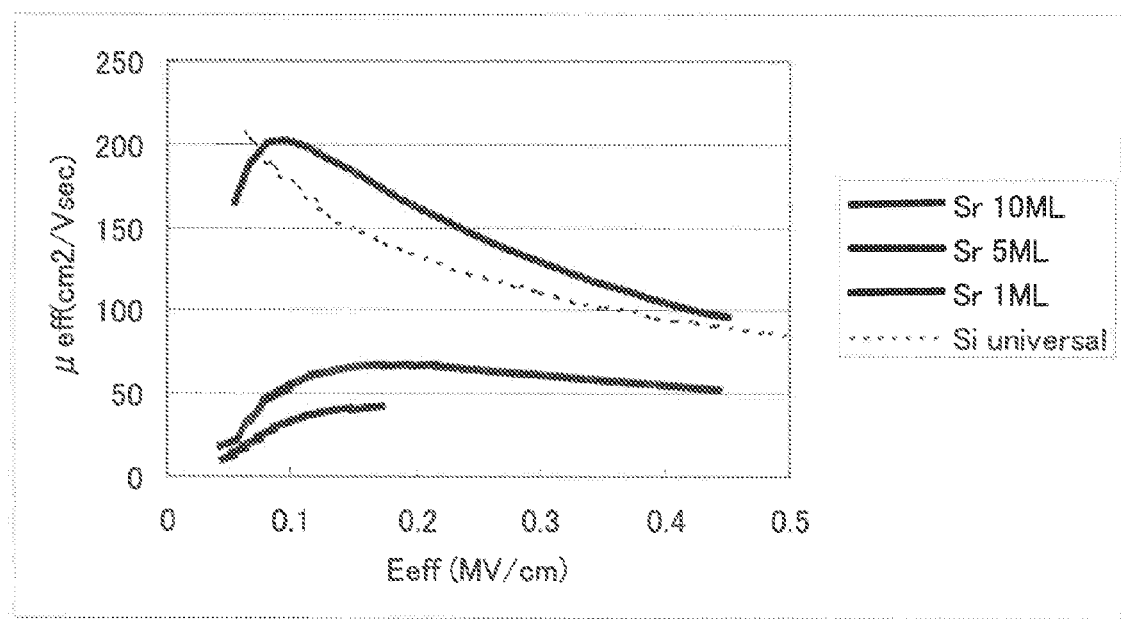
FIG. 9 is a graph showing mobility of each sample according to the second embodiment.

$BF_{2+}$ ions are implanted into the Ge substrate at $5\times10^{15}$ (/cm$^2$) and 50 keV to form the source/drain regions. After that, pretreatment is performed, and heat treatment at 400° C. is performed in an MBE chamber to reveal a washed Ge (2×1) surface. After the temperature is dropped down to 200° C., three samples including: a sample without any deposition of Sr; a sample with deposition of $7\times10^{14}$ (/cm$^2$) of Sr; and a sample with deposition of $3.5\times10^{15}$ (/cm$^2$) of Sr are produced at the same temperature respectively. On the assumption of 1 ML=$7\times10^{14}$ (/cm$^2$), the three samples correspond to Sr 0 ML, Sr 1 ML and Sr 5 ML respectively. When the temperature is 200° C., Sr reacts with Ge as soon as Sr is deposited thereon in the same manner as at 400° C. $LaAlO_3$ is deposited to a film thickness of 10 nm to form a high-k/Ge gate stack structure. PDA (Post Deposition Annealing) is performed in $N_2$ atmosphere at 400° C. for 30 minutes. And, a gate electrode, source/drain contacts and a back-surface contact are formed, thereby forming high-k/Ge p-MOSFETs. FIG. 9 shows the holemobility of the aforementioned three samples. As shown in FIG. 9, the mobility of each sample (Sr1ML, Sr5ML) containing Sr deposited therein is higher than that of the sample (Sr 0 ML) containing no Sr deposited therein. It is proved that the mobility of a semiconductor device can be improved by forming a Sr germanide layer in a high-k/Ge interface. In addition, it is proved that the hole mobility of the sample containing 5 ML of Sr deposited therein exceeds the Si universal curve.

Third Embodiment

The third embodiment explains a method for manufacturing the semiconductor device according to the first embodiment. In the third embodiment, metal containing Sr or Ba is deposited on a Ge substrate, and then heat treatment is applied thereto to form a non-metallic Ge compound layer. The heat treatment may be performed either before or after depositing an insulator film. The other processes are similar to those in the second embodiment. FIGS. 13A-13D show a typical example of the third embodiment.

In the case of Sr, the heat treatment may be performed at 755° C. or higher. For example, according to a phase diagram between Sr and Ge, when Sr is 19.3 atm %, Sr is liquidized at 755° C. or higher and phase-separated into a composition of Ge and $SrGe_2$. Therefore, by dropping down the temperature after heating to 755° C., a $SrGe_2$ layer can be formed on the Ge substrate. The heat treatment may be performed at a temperature higher than 755° C. The phase diagram is made with reference to Smithells Metals Reference Book, 8th edition by W. F. Gale, T. C. Totemeier and Colin James Smithells, Butterworth-Heinemannn, 2003/8. Phase diagrams in the following description are made with reference to the same document.

In the same manner, in the case of Ba, the heat treatment may be performed at 815° C. or higher.

Fourth Embodiment

The fourth embodiment is the same as the third embodiment, except that an SiGe substrate is used as the semiconductor substrate.

Heat treatment may be performed either before or after depositing an insulator film. The heat treatment may be performed at 755° C. or higher.

Fifth Embodiment

The fifth embodiment explains a method for manufacturing the semiconductor device according to the first embodiment. In the fifth embodiment, a non-metallic Ge compound layer is deposited on a Ge substrate, and then an insulator film is formed. The other processes are similar to those in the second embodiment. FIGS. 14A-14C show a typical example of the fifth embodiment.

Examples of compositions of compound layers of Sr and Ge to be deposited include $SrGe_2$, $SrGe$, $Sr_2Ge$, $Sr_4Ge_3$, etc. These compounds may be used alone or in combination.

Likewise, examples of compound layers of Ba and semiconductor include $Ba(Si_{1-x}Ge_x)_2$, $Ba(Si_{1-x}Ge_x)$, $Ba_2(Si_{1-x}Ge_x)$ and $Ba_4(Si_{1-x}Ge_x)_3$. These compounds may be used alone or in combination as the non-metallic Ge compound layer 2. For example, when the semiconductor region lying under the non-metallic Ge compound layer 2 is composed of 100% Ge, a compound of Ba and Ge may be used as the non-metallic Ge compound layer 2 in order to suppress adverse effect caused by diffusion of Si.

For example, in view of small lattice mismatching and easy epitaxial growth, $SrGe_2$ and $BaGe_2$ are preferable.

Sixth Embodiment

The sixth embodiment explains a method for manufacturing the semiconductor device according to the first embodiment. In the sixth embodiment, a metal oxide film containing Sr or Ba is deposited on a Ge substrate, then an insulator film is formed thereon, and then heat treatment is applied thereto to deoxidize the metal oxide film and form a non-metallic Ge compound layer. The other processes are similar to those in the second embodiment. FIGS. 15A-15D show a typical example of the sixth embodiment.

$BF_{2+}$ ions are implanted into the source/drain regions of the Ge substrate at $5\times10^{15}$ (/cm$^2$) and 50 keV. After that, pretreatment is performed, and heat treatment at 400° C. is performed in an MBE chamber to reveal a washed Ge (2×1) surface. After the temperature is dropped down to 200° C., Sr is deposited in oxygen atmosphere under a pressure of $5\times10^{-6}$ Torr while keeping the temperature. Thus, Sr oxide 6 is formed to 1 nm thickness. In this embodiment, the heat treatment temperature may be 200° C. or higher, and the pressure may be $5\times10^{-6}$ Torr or lower.

Figure 10:
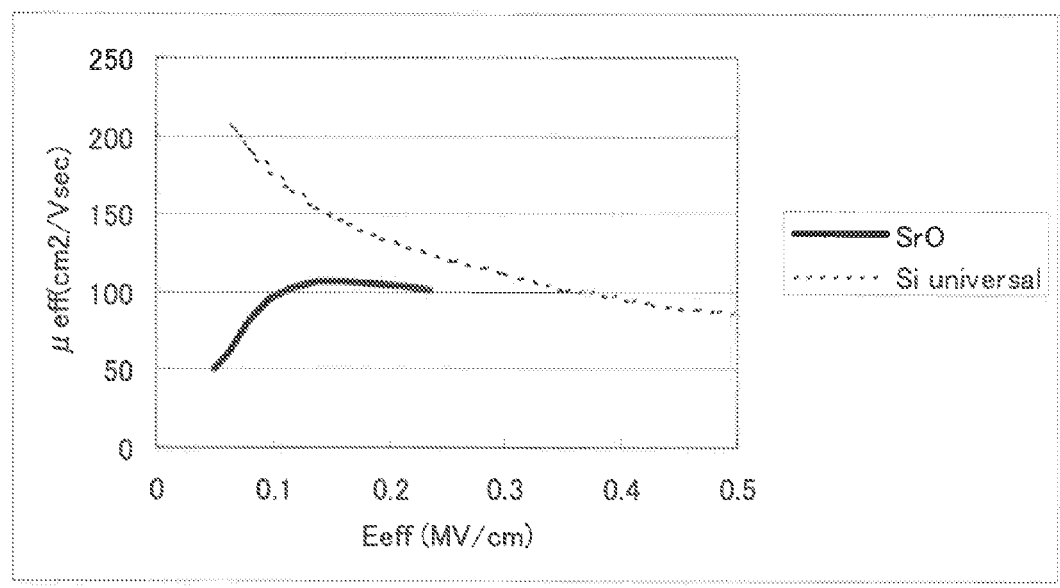
FIG. 10 is a graph showing mobility of a sample according to a sixth embodiment of the invention.

$LaAlO_3$ with a film thickness of 10 nm is deposited to form a high-k/Ge gate stack structure. PDA (Post Deposition Annealing) is performed in $N_2$ atmosphere at 400° C. for 30 minutes. And, a gate electrode, source/drain contacts and a back-surface contact are formed to form high-k/Ge p-MOSFETs. FIG. 10 shows the hole mobility of the samples obtained thus.

Figure 11:
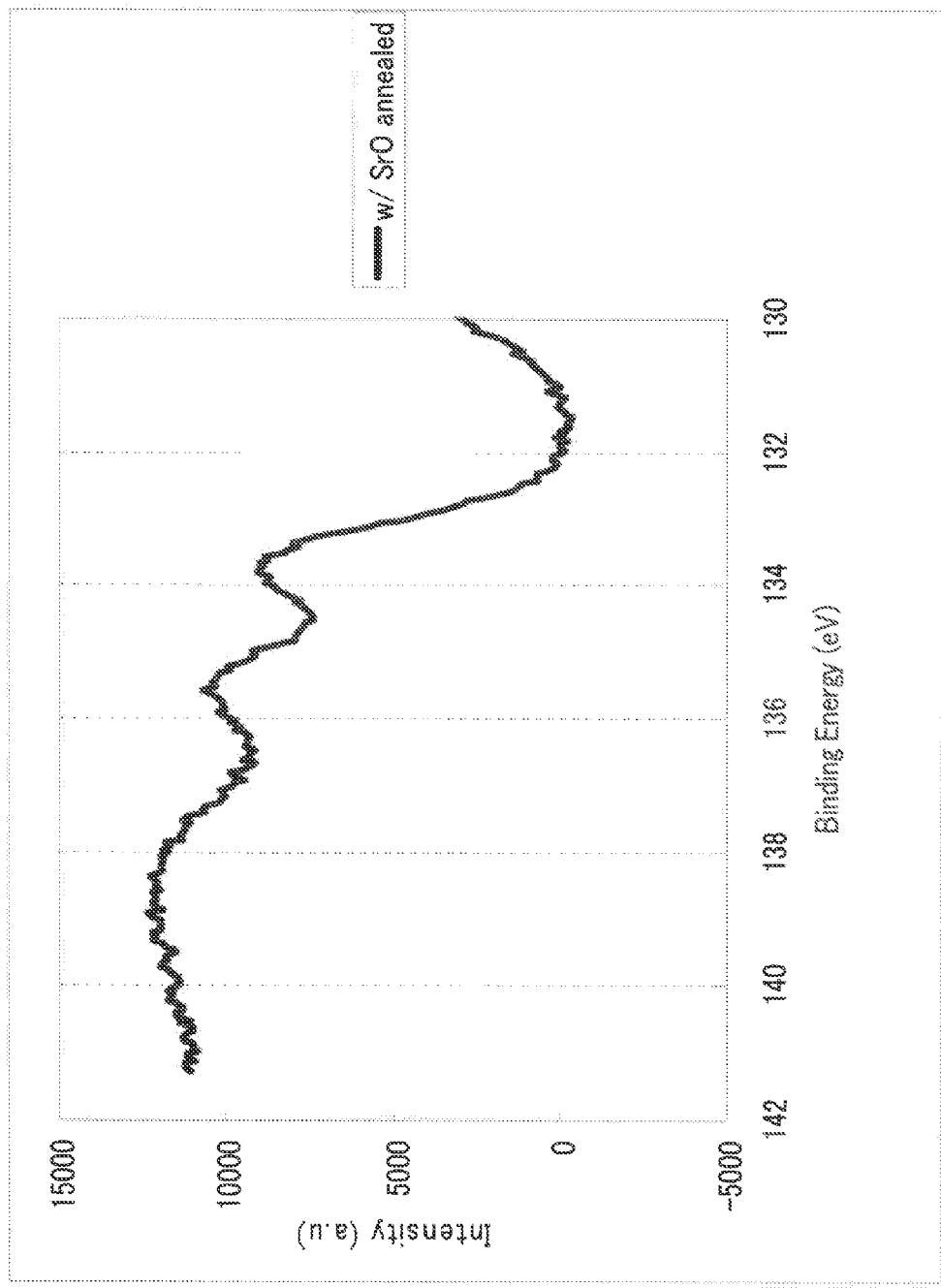
FIG. 11 is a graph showing an XPS result of a sample according to the sixth embodiment.

FIG. 11 shows XPS Sr3d spectra of similar samples treated by PDA ($N_2$ atmosphere, 400° C., 30 minutes). Peaks appear in similar positions to those in FIG. 5. For similar reasons, it is understood from the peaks in FIG. 11 that Sr—Ge bond has been formed.

Here, the heat treatment is performed upon the substrate where $LaAlO_3$ is deposited on SrO. $LaAlO_3$ is negatively higher in Gibbs free energy than SrO, that is, thermally more stable than SrO. It is therefore considered that SrO is partially reduced during the heat treatment and formed into Sr metal, and the Sr metal reacts with Ge of the substrate to form Sr germanide.

Examples of insulator films having negatively higher Gibbs free energy than that of Sr oxide or Ba oxide include oxides of La, Ce, Pr, Nd, Sm, Eu, Gd, Tb, Dy, Ho, Er, Tm, Yb, Lu, Ti, Zr, Hf, B, Al, Ga, Be, Mg and Ca.

Seventh Embodiment

The seventh embodiment explains a method for manufacturing the semiconductor device according to the first embodiment. In the seventh embodiment, Sr or Ba is introduced into a Ge substrate, then an insulator film is formed on the Ge substrate, and then heat treatment is performed thereon to segregate Sr or Ba in the interface between a semiconductor region of the Ge substrate and the insulator film to form a non-metallic Ge compound layer. The other processes are similar to those in the second embodiment. FIGS. 16A-16D show a typical example of the seventh embodiment.

To introduce metal elements, for example, $Sr^+$ ions are implanted into the Ge substrate at $1\times10^{15}$ (/cm$^2$) and an acceleration voltage of 10 keV. The ion implantation may be performed as shown in FIG. 16A, or may be performed to penetrate through the insulator film. It is desired that the heat treatment to segregate metal shown in FIG. 16C is performed at 200° C. or higher.

Eighth Embodiment

Figure 17:
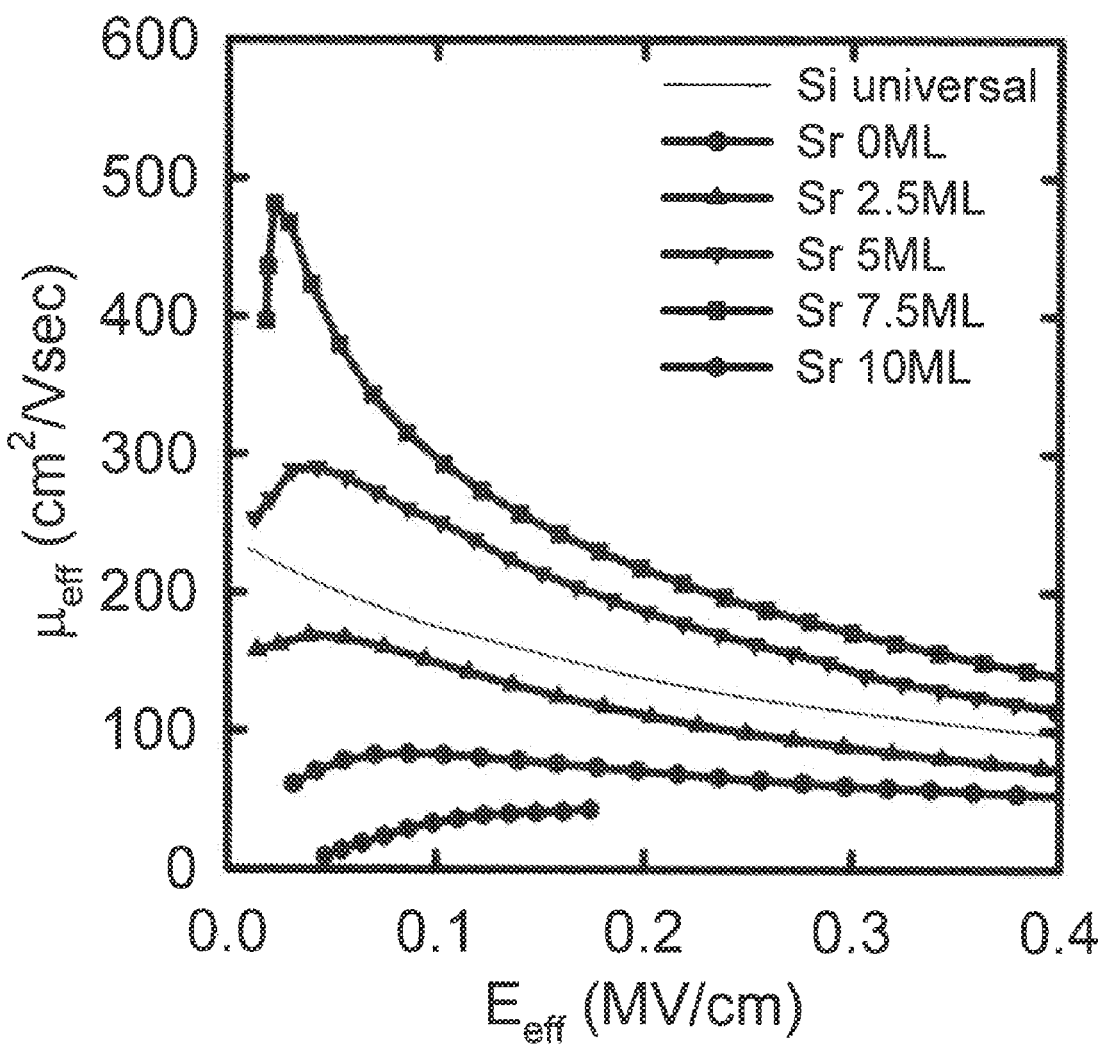
FIG. 17 is a graph showing mobility of a sample according to a eighth embodiment of the invention.

The eighth embodiment explains a method for manufacturing the semiconductor device according to the first embodiment, and is similar to the second embodiment. In the eighth embodiment, a depositing amount of Sr is changed from 0 ML to 10 ML at 2.5 ML intervals. The heating temperature of when the metal is deposited is 200° C. As shown in FIG. 17, in case where 5 ML or 7.5 ML of Sr is deposited, the effective mobility $\mu_{eff}$ exceeding the Si universal curve is acquired. Remarkably, when Sr is deposited to 7.5 ML, the world's highest effective mobility $\mu_{eff}$ of 481 (cm$^2$/Vsec) is the high-k/Ge system is accomplished.

Ninth Embodiment

Figure 19:
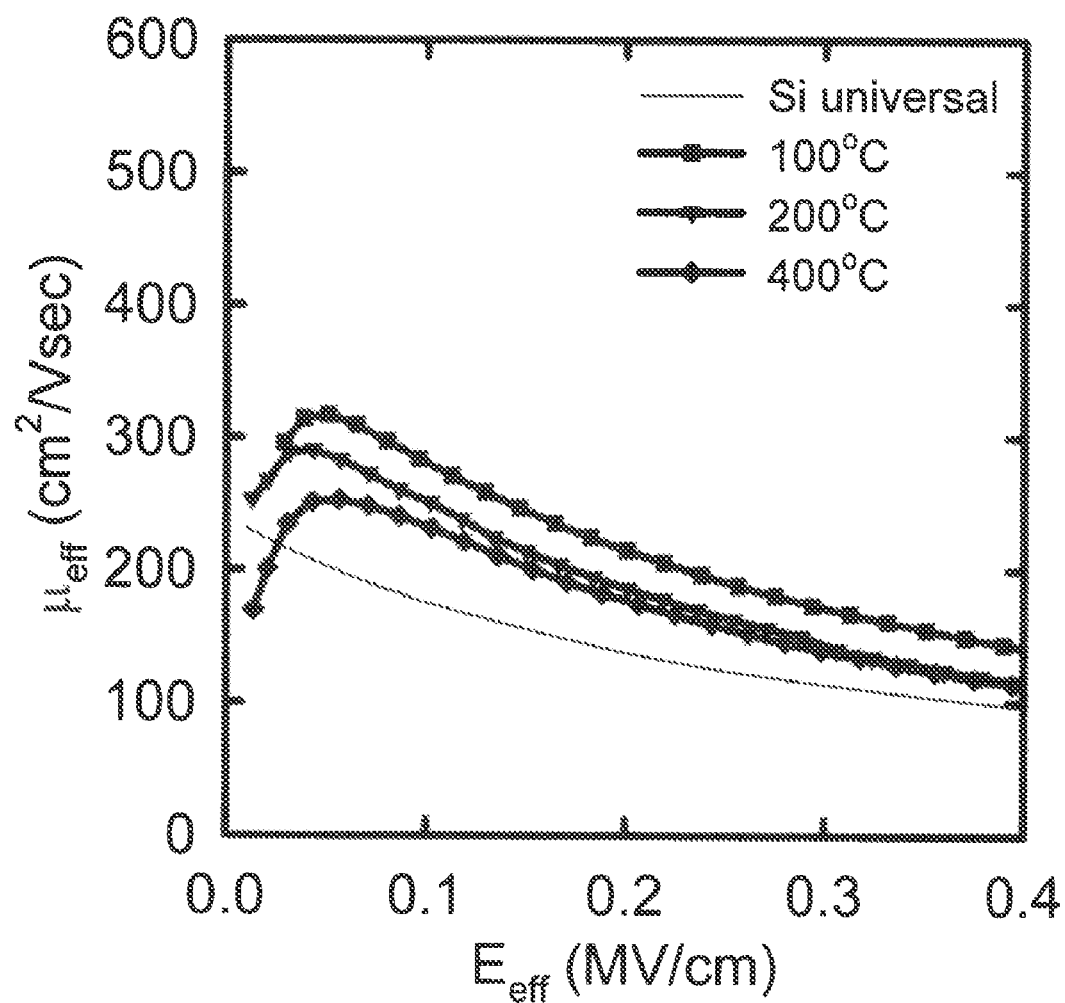
FIG. 19 is a graph showing mobility of a sample according to the ninth embodiment.

The ninth embodiment explains a method for manufacturing the semiconductor device according to the first embodiment, and is similar to the second embodiment. In the ninth embodiment, the heating temperature of when the metal is deposited is changed from 100° C. to 400° C. For example, when the semiconductor substrate has been heated in the previous step, as shown in FIGS. 18A-18E, the deposition temperature is adjusted by cooling the semiconductor substrate. 5 ML of Sr is deposited. As shown in FIG. 19, the effective mobility $\mu_{eff}$ exceeding the Si universal curve is acquired in the temperature range. Further, as the heating temperature is decreased, the higher effective mobility $\mu_{eff}$ is obtained.

The reason why the higher effective mobility $\mu_{eff}$ is obtained as the Sr deposition temperature is lowered is considered to attribute to surface energies of Sr and Ge shown in Table. 3. As shown in Table 3, the surface energy of Sr is smaller than that of Ge. When depositing Sr on Ge, it is considered that the favorable non-metallic Ge compound layer can be acquired in a case where Sr is deposited in the form of layer since Sr is regularly-arranged, as compared with a case where Sr is deposited in the form of grain. Since Sr tends to be in the form of grain, in order to form Sr in the form of layer, it may be preferable to lower the temperature, for example, to 100° C.

In the eighth embodiment, the highest effective mobility $\mu_{eff}$ is acquired in the case where the deposition temperature is 200° C. and the Sr deposition amount is 7.5 ML. In order to further increase the effective mobility $\mu_{eff}$, for example, the condition in which the deposition temperature is 100° C. and the Sr deposition amount is 7.5 ML may be used.

TABLE 3

| | Surface Energy (mJ/m$^2$) |
|---|---|
| Si | 865 |
| Ge | 621 |
| Sr | 303 |

Tenth Embodiment

Figure 20:
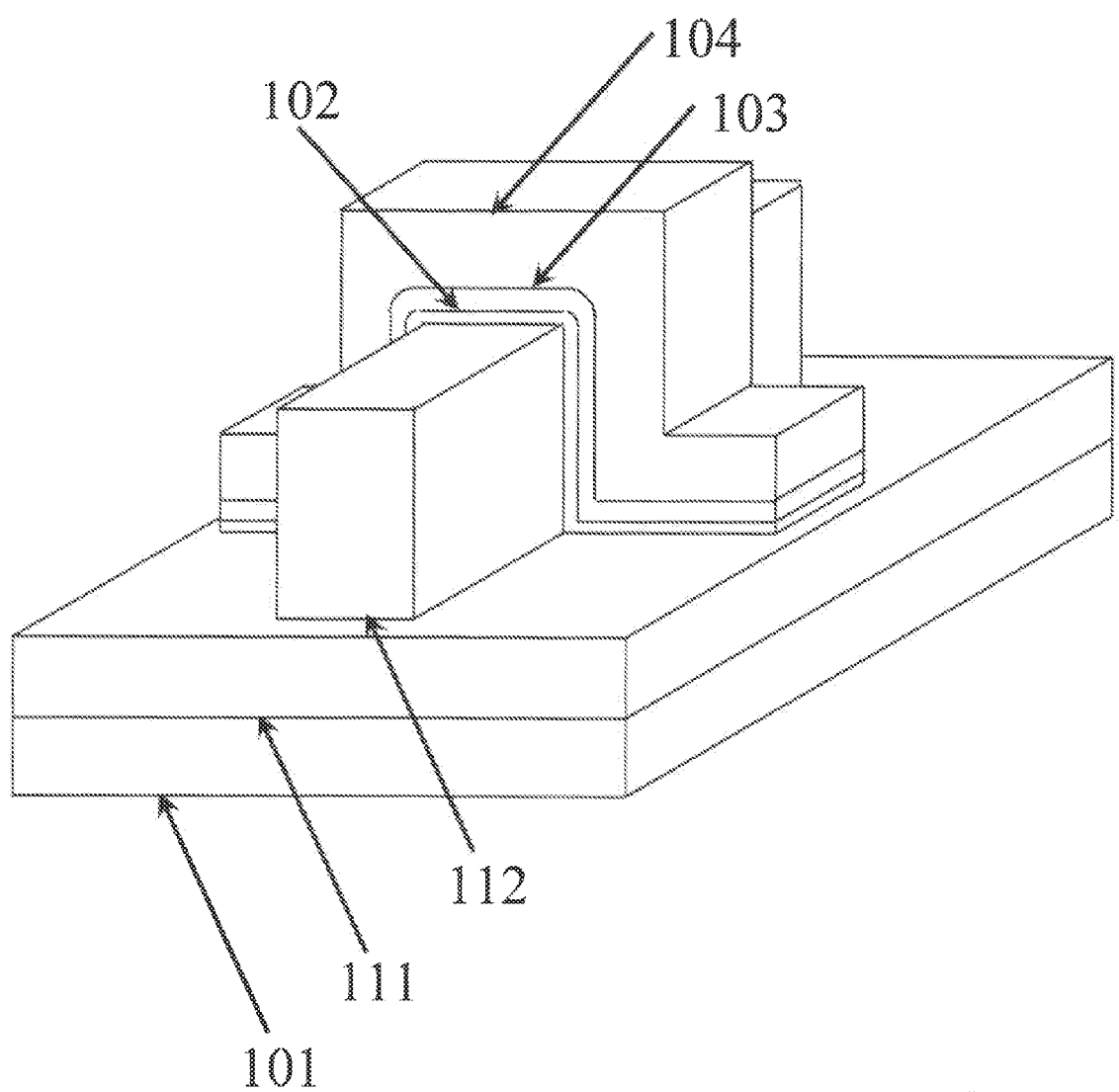
FIG. 20 illustrates a semiconductor device according to a tenth embodiment of the invention.

FIG. 20 illustrates a semiconductor device according to a tenth embodiment of the invention. The semiconductor device according to the tenth embodiment is the Fin type device having a non-metallic Ge compound layer. As shown in FIG. 20, The Fin type device according to the tenth embodiment has a semiconductor substrate 101, a bulk insulator 111, a semiconductor region 112, a non-metallic Ge compound layer 102, an insulator film 103 and a gate electrode 104. Also in this Fin type device, the interface characteristics can be improved by putting the non-metallic Ge compound layer 102 into the interface between the semiconductor region 112 having Ge as a primary component and the high-k insulator film 103. A region on which FinFET is formed is not limited to the insulator region (bulk insulator 111), and FinFET may be formed on the semiconductor region.

The invention is not limited to the above-described embodiments and can be embodied by changing the constituting elements without departing from the scope and spirit of the invention. Various types of the variations can be made by properly combining the plurality of constituting elements disclosed in the embodiments. For example, some constituting elements may be removed from all of the constituting elements disclosed in the embodiments. In addition, different constituting elements according to a different embodiment may be properly combined.

According to an aspect of the present invention, there is provided a semiconductor device having superior mobility and a manufacturing method of the semiconductor device.

What is claimed is:

1. A semiconductor device comprising:
   a substrate that includes a semiconductor region including Ge as a primary component;
   a compound layer that is formed above the semiconductor region, that includes Ge and that has a non-metallic characteristic;
   an insulator film that is formed above the compound layer;
   an electrode that is formed above the insulator film; and
   source/drain regions that are formed in the substrate so as to sandwich the electrode therebetween,
   wherein the compound layer includes at least one selected from a group consisting of:
      a compound of Sr and Ge;
      a compound of Ba and Ge;
      a compound of Ba, Si, and Ge, and
   wherein a depositing amount of the compound layer is greater than or equal to 2.5 monolayers and smaller than or equal to 10 monolayers, and
   wherein the compound layer is amorphously formed.

2. The semiconductor device according to claim 1,
   wherein a Gibbs free energy of the insulator film is negatively higher than that of the compound layer.

3. The semiconductor device according to claim 1,
wherein a Sr oxide or a Ba oxide is provided between the compound layer and the insulator film.

4. The semiconductor device according to of claim 1,
wherein the semiconductor region has a Ge concentration equal to or higher than 85%.

5. The semiconductor device according to claim 1,
wherein the insulator film includes La and Al.

6. A method for manufacturing a semiconductor device, comprising:
preparing a substrate that includes a semiconductor region including Ge as a primary component;
forming a compound layer above the semiconductor region, the compound layer including Ge, the compound layer having a non-metallic characteristic;
forming an insulator film above the compound layer;
forming an electrode above the insulator film; and
forming source/drain regions in the substrate so as to sandwich the electrode therebetween,
wherein the compound layer includes at least one selected from a group consisting of:
a compound of Sr and Ge;
a compound of Ba and Ge;
a compound of Ba, Si, and Ge, and
wherein a depositing amount of the compound layer is greater than or equal to 2.5 monolayers and less than or equal to 10 monolayers, and
wherein the compound layer is amorphously formed.

7. The method according to claim 6,
wherein the step of forming the compound layer includes:
depositing a metal including Sr or Ba above the semiconductor region; and
reacting the metal with the semiconductor region thereby forming the compound layer.

8. The method according to claim 7, further comprising:
heating the substrate,
wherein the metal is deposited above the heated substrate.

9. The method according to claim 7,
wherein a heating process is performed to react the metal with the semiconductor region.

10. The method according to claim 9,
wherein the insulator film is formed above the metal before the heating process has been performed to prevent the compound layer from being desorbed, and
wherein the compound layer is formed through the heating process.

11. The method according to claim 6,
wherein the step of forming the compound layer includes:
depositing the compound layer above the semiconductor region.

12. The method according to claim 11,
wherein the deposited compound layer includes at least one selected from the group consisting of:
$SrGe_2$;
$SrGe$;
$Sr_2Ge$;
$Sr_4Ge_3$;
$Ba(Si_{1-x}Ge_x)_2$;
$Ba(Si_{1-x}Ge_x)$;
$Ba_2(Si_{1-x}Ge_x)$; and
$Ba_4(Si_{1-x}Ge_x)_3$, where x is equal to or larger than 0 and smaller than or equal to 1.

13. The method according to claim 6,
wherein the step of forming the compound layer includes:
forming a metal oxide film including Sr or Ba above the semiconductor region;
forming the insulator film above the metal oxide film; and
performing a heating process thereby causing a reduction of the metal oxide film.

14. The method according to claim 6,
wherein the step of forming the compound layer includes:
introducing Sr or Ba into the semiconductor region;
forming the insulator layer above the semiconductor region; and
performing a heating process thereby segregating Sr or Ba in an interface between the semiconductor region and the insulator film.

15. The method according to claim 6, further comprising:
adjusting a temperature of the substrate to be equal to or lower than 200° C.

16. The semiconductor device according to claim 1,
wherein the depositing amount of the compound layer is greater than or equal to 5 monolayers and smaller than or equal to 7.5 monolayers.

17. The semiconductor device according to claim 1,
wherein the insulator film includes at least one oxide selected from a group consisting of:
oxides of La, Ce, Pr, Nd, Sm, Eu, Gd, Tb, Dy, Ho, Er, Tm, Yb, Lu, Ti, Zr, Hf, B, Al, Ga, Be, Mg, and Ca.

18. A semiconductor device comprising:
a substrate that includes a semiconductor region including Ge as a primary component;
a compound layer that is formed above the semiconductor region, that includes Ge and that has a non-metallic characteristic;
an insulator film that is formed above the compound layer;
an electrode that is formed above the insulator film; and
source/drain regions that are formed in the substrate so as to sandwich the electrode therebetween,
wherein the compound layer includes at least one selected from a group consisting of:
a compound of Sr and Ge;
a compound of Ba and Ge;
a compound of Ba, Si, and Ge, and
wherein a depositing amount of the compound layer is greater than or equal to 2.5 monolayers and smaller than or equal to 10 monolayers, and
wherein the insulator film is amorphously formed.

19. The method according to claim 6,
wherein the depositing amount of the compound layer is greater than or equal to 5 monolayers and smaller than or equal to 7.5 monolayers.

20. The method according to claim 6,
wherein the insulator film includes at least one oxide selected from a group consisting of:
oxides of La, Ce, Pr, Nd, Sm, Eu, Gd, Tb, Dy, Ho, Er, Tm, Yb, Lu, Ti, Zr, Hf, B, Al, Ga, Be, Mg, and Ca.

21. A method for manufacturing a semiconductor device, comprising:
preparing a substrate that includes a semiconductor region including Ge as a primary component;
forming a compound layer above the semiconductor region, the compound layer including Ge, the compound layer having a non-metallic characteristic;
forming an insulator film above the compound layer;
forming an electrode above the insulator film; and
forming source/drain regions in the substrate so as to sandwich the electrode therebetween, wherein the compound layer includes at least one selected from a group consisting of:
  a compound of Sr and Ge;
  a compound of Ba and Ge;
  a compound of Ba, Si, and Ge, and wherein a depositing amount of the compound layer is greater than or equal to 2.5 monolayers and less than or equal to 10 monolayers, and wherein the insulator film is amorphously formed.

* * * * *